US012700809B2

(12) United States Patent
Saadat et al.

(10) Patent No.: US 12,700,809 B2
(45) Date of Patent: Aug. 4, 2026

(54) HALF-BRIDGE SWITCH ARRANGEMENT

(71) Applicant: SEG Automotive Germany GmbH, Stuttgart (DE)

(72) Inventors: Nima Saadat, Stuttgart (DE); Hossein Abedini, Stuttgart (DE); Eric Pertermann, Stuttgart (DE); Andreas Winterl, Zandt (DE); Thomas Kaiser, Zandt (DE); Benjamin Karl, Zandt (DE); Markus Jetz, Zandt (DE)

(73) Assignee: SEG Automotive Germany GmbH, Stuttgart (DE)

( * ) Notice: Subject to any disclaimer, the term of this patent is extended or adjusted under 35 U.S.C. 154(b) by 184 days.

(21) Appl. No.: 18/789,860

(22) Filed: Jul. 31, 2024

(65) Prior Publication Data

US 2025/0055384 A1 Feb. 13, 2025

(30) Foreign Application Priority Data

Aug. 9, 2023 (DE) .......................... 102023121298.2

(51) Int. Cl.
H02M 7/00 (2006.01)
H05K 7/14 (2006.01)
(Continued)

(52) U.S. Cl.
CPC ........ H02M 7/003 (2013.01); H05K 7/14329 (2022.08); H05K 7/2089 (2013.01); H10W 90/00 (2026.01)

(58) Field of Classification Search
CPC . H02M 7/003; H05K 7/14329; H05K 7/2089; H10W 90/00
See application file for complete search history.

(56) References Cited

U.S. PATENT DOCUMENTS

| | | | | |
|---|---|---|---|---|
| 5,936,833 A | * | 8/1999 | Grossman | ............. H02M 7/003 |
| | | | | 363/132 |
| 2014/0362627 A1 | * | 12/2014 | Sun | ....................... H02M 7/003 |
| | | | | 363/132 |

(Continued)

FOREIGN PATENT DOCUMENTS

| | | |
|---|---|---|
| DE | 102011088250 A1 | 6/2013 |
| DE | 102020119169 A1 | 1/2022 |
| DE | 102020214912 A1 | 6/2022 |

OTHER PUBLICATIONS

German Search Results in corresponding German Patent Application No. 102023121298.2, dated Apr. 11, 2024, 1 page.

*Primary Examiner* — Rafael O De Leon Domenech
(74) *Attorney, Agent, or Firm* — Cozen O'Connor

(57) ABSTRACT

A half-bridge switch arrangement has a plurality of parallel-connected half-bridges, each half-bridge having a first semiconductor switching element and a second semiconductor switching element, has a first busbar, to which a first terminal of each of the first semiconductor switching elements is electrically connected, a second busbar, to which a second terminal of each of the first semiconductor switching elements and a first terminal of each of the second semiconductor switching elements are electrically connected, and has a third busbar, to which a second terminal of each of the second semiconductor switching elements is electrically connected. The first and second busbars are toothed and the semiconductor switching elements are arranged on the teeth, the teeth being arranged alternately. The third busbar is arranged above the semiconductor switching elements, and a heat sink is arranged below the first and second busbars.

15 Claims, 8 Drawing Sheets

(51) Int. Cl.
    *H05K 7/20*         (2006.01)
    *H10W 90/00*      (2026.01)

(56)               References Cited

U.S. PATENT DOCUMENTS

| | | | |
|---|---|---|---|
| 2016/0094153 A1* | 3/2016 | Li | H02M 7/487 |
| | | | 363/123 |
| 2018/0226315 A1* | 8/2018 | Gottwald | H10W 74/114 |
| 2018/0351498 A1* | 12/2018 | Ilic | H02P 27/04 |
| 2019/0080992 A1* | 3/2019 | Joos | H10W 90/811 |
| 2022/0311349 A1* | 9/2022 | Pahn | H02G 5/02 |
| 2022/0345027 A1* | 10/2022 | Boehmer | H02M 5/458 |
| 2023/0411359 A1* | 12/2023 | McPherson | H10W 90/00 |
| 2024/0178108 A1* | 5/2024 | Nuotio | H10W 70/413 |
| 2024/0339439 A1* | 10/2024 | Hövermann | H10W 90/00 |

\* cited by examiner

Fig. 2d

HALF-BRIDGE SWITCH ARRANGEMENT

CROSS-REFERENCE TO RELATED APPLICATIONS

This application claims priority to German Patent Application No. 102023121298.2 filed Aug. 9, 2023 which is hereby incorporated by reference in its entirety.

TECHNICAL FIELD

The present disclosure relates to a half-bridge switch arrangement.

BACKGROUND

Half-bridge switch arrangements can be used in power converters, for example, as inverters for alternating conversion between DC and AC voltages. For example, such half-bridge switch arrangements can be used in power modules in (motor) vehicles to convert a voltage between a DC on-board power supply and an electrical machine that can be operated with multi-phase AC voltage.

Such half-bridge switch arrangements have one half-bridge per phase with one high-side switch and one low-side switch. Individual, discrete semiconductor switching elements, such as individual transistors like FETs, MOSFETs, IGBTs, etc., can be used as high-side or low-side switches. Furthermore, a plurality of such half-bridges can also be connected in parallel per phase, each with a first discrete semiconductor switching element and a second discrete semiconductor switching element, whereby the first semiconductor switching elements of these parallel-connected half-bridges form the high-side switch and whereby the second semiconductor switching elements of these parallel-connected half-bridges form the low-side switch.

By connecting half bridges in parallel in this way, high power scalability and high power and current levels can be achieved. However, this often results in a high DC link inductance and therefore a high total inductance of the commutation loop. It can also often prove difficult to cool such half-bridge switch arrangements sufficiently in order to keep temperatures at desired values at high currents and high switching frequencies.

SUMMARY

According to the disclosure, a half-bridge switch arrangement with the features of claim 1 is proposed. Advantageous embodiments are the subject of the dependent claims and the following description.

The half-bridge switch arrangement has a plurality of parallel-connected half-bridges, each half-bridge having a first semiconductor switching element and a second semiconductor switching element. Accordingly, the half-bridge switch arrangement has a plurality of first semiconductor switching elements and a plurality of second semiconductor switching elements, the number of first semiconductor switching elements and the number of second semiconductor switching elements corresponding expediently to the number of half-bridges. The first semiconductor switching elements of the parallel-connected half-bridges expediently form a high-side switch, and the second semiconductor switching elements of the parallel-connected half-bridges expediently form a low-side switch. The individual semiconductor switching elements can each be designed, for example, as a transistor, e.g. as an FET, MOSFET, IGBT, etc.

Furthermore, the half-bridge switch arrangement has a first busbar, a second busbar and a third busbar. For example, these busbars can each be made of copper or contain copper. A first terminal of each of the first semiconductor switching elements, for example a drain terminal, is electrically connected to the first busbar. A second terminal of each of the first semiconductor switching elements, for example a source terminal, is electrically connected to the second busbar. Furthermore, a first terminal of each of the second semiconductor switching elements, for example a drain terminal, is electrically connected to the second busbar. A second terminal of each of the second semiconductor switching elements, for example a source terminal, is electrically connected to the third busbar. In this sense, the first and third busbars form the DC link connections and the second busbar forms the center tap.

The second busbar can, for example, be provided as a phase connection busbar. The first busbar can, for example, be provided as a positive voltage busbar (positive busbar, "B+ busbar"), or negative voltage busbar (negative busbar, "B-busbar"). The third busbar can then be provided as the other busbar selected from the positive and negative busbars.

The half-bridge switch arrangement also has a heat sink, which is suitably provided and set up for cooling the busbars and the semiconductor switching elements. For example, the heat sink can be fluid-cooled and have an inlet and outlet for a corresponding cooling fluid. The cooling fluid can comprise oil, water, air, etc.

The first busbar has a first section and a plurality of second sections, wherein the second sections of the first busbar adjoin the first section of the first busbar and wherein a notch is provided between each of the individual second sections of the first busbar. In particular, the first busbar is thus comb-shaped, with the first section forming the comb back and the second sections forming the comb teeth or tines. The first section is in particular plate-shaped or flat or straight in cross-section. The individual second sections are in particular also plate-shaped and each adjoin a side, lateral surface or edge of the first section at predetermined, in particular equidistant distances from one another. Conveniently, the individual second sections each have the same shape and dimensions. In particular, the notches between the second sections also have the same shapes and dimensions. Starting from the corresponding side or edge of the first section, the second sections thus connect to the first section in particular as protrusions or teeth.

One of the plurality of first semiconductor switching elements is arranged on each of these second sections of the first busbar, in particular in each case on a surface or upper side of the respective second section. Expediently, all first semiconductor switching elements are thus arranged on the same side of the first busbar on its second sections.

Corresponding to the first busbar, the second busbar also has a first, in particular plate-shaped section and a plurality of second sections, in particular plate-shaped sections, wherein these second sections of the second busbar in particular adjoin the first section of the second busbar at equidistant distances from one another, so that a notch is provided between each of the individual second sections of the second busbar. Conveniently, the shapes and dimensions of these second sections and these notches correspond to each other. This second busbar is therefore also comb-shaped in particular, with the first section forming the comb back and the second sections forming the comb teeth. The individual second sections of this second busbar extend from a side, lateral surface or edge of the respective first section, in particular as projections or teeth.

One of the plurality of second semiconductor switching elements is arranged on each of the second sections of the second busbar, in particular in each case on a surface or upper side of the respective second section. In particular, all of the second semiconductor switching elements are arranged on the same side of the second busbar on the respective second sections.

The first busbar and the second busbar are arranged relative to each other such that the second sections of the second busbar are arranged within the notches between second sections of the first busbar in a projection onto the main plane of extension of the first busbar, and that the second sections of the first busbar are arranged within the notches between the second sections of the second busbar in a projection onto the main plane of extension of the second busbar.

The second sections of the second busbar are thus arranged in particular above, inside or below one of the notches between the second sections of the first busbar. Accordingly, the second sections of the first busbar are arranged in particular below, inside or above one of the notches between the second sections of the second busbar.

The first section of the first busbar and the first section of the second busbar are conveniently arranged parallel to each other. In particular, all second sections and also the main extension planes of the individual first and second semiconductor switching elements are thus also arranged parallel to one another.

For example, the respective first section and the respective second sections of the first busbar and the second busbar can each be arranged in the same plane, so that the second sections of the second busbar are arranged within the notches of the first busbar and vice versa.

For example, the first section of the first busbar can be arranged above or at least slightly upwardly offset from the first section of the second busbar when viewed in a (height) direction perpendicular to the main plane of extension of this first section, so that the second sections of the positive busbar are located above or at least slightly upwardly offset from the notches of the second busbar when viewed in this height direction, or so that the second sections of the second busbar are located below or at least slightly downwardly offset from the notches of the first busbar when viewed in the height direction.

Conversely, the first section of the first busbar can also be arranged below or at least slightly offset downwards from the first section of the second busbar when viewed in the vertical direction. In this case, the second sections of the first busbar are arranged below or at least slightly offset downwards relative to the notches in the second busbar when viewed in the vertical direction, and correspondingly the second sections of the second busbar are arranged above or at least slightly offset upwards relative to the notches in the first busbar when viewed in the vertical direction.

The individual second sections of the first busbar and the second busbar as projections or teeth thus each conveniently engage in the notches of the respective other busbar as a receptacle for the teeth, either directly in the same plane perpendicular to the height direction or offset relative to one another when viewed in the height direction.

The third busbar is arranged on a first side of the arrangement comprising the first busbar and the second busbar, which has the first semiconductor switching elements and the second semiconductor switching elements, i.e. on the same side as the semiconductor switching elements. The heat sink is arranged on a second side of the arrangement comprising the first busbar and the second busbar opposite the first side, i.e. on the other side. The third busbar expediently has a first section, which is in particular plate-shaped. A main extension plane of the third busbar or the first section of the third busbar and the respective first section and the respective second sections of the first busbar and the second busbar are each arranged in particular parallel to one another.

An outer surface of the individual first and second semiconductor switching elements is in thermal contact with the first busbar and the second busbar respectively. The individual busbars in turn are in thermal contact with the heat sink (on the other side). In this way, heat from the individual switching elements and the individual busbars can be effectively transferred to the heat sink and dissipated from it. The busbars can usefully serve as heat conductors in order to improve the overall thermal resistance. The special (comb) shape of the first busbar and the third busbar can facilitate the connection of the individual semiconductor switching elements to the respective busbar and improve the electrical conductivity as well as the heat transfer from the switching elements to the heat sink.

The disclosure provides a half-bridge switch arrangement with a low DC link inductance, a low commutation loop inductance and a low thermal impedance, which can be effectively cooled.

By connecting the half bridges in parallel with discrete switching elements, a high scalability of the power can be achieved. The number of semiconductor switching elements or half bridges can be appropriately selected to achieve a desired power or current. Furthermore, the overall costs for the circuit can be kept low by using discrete switching elements.

Conventionally, the use of parallel, discrete semiconductor switching elements can often lead to a high parasitic inductance, which can be critical, for example at a high switching speed of wide-bandgap semiconductors (WBGs) such as SiC (silicon carbide) or GaN (gallium nitride). Such parasitic inductance can be minimized or at least reduced in the switch arrangement according to the disclosure.

The busbars are advantageously arranged close to each other, whereby inductive resistance can be reduced or kept low. In particular, a low DC link inductance and a low overall inductance of the commutation loop can be achieved. The commutation loop can be optimized due to the short distances between the lines or terminals of the switching elements and the busbars. The busbars can, for example, be laminated busbars with very low inductance, which enable the half bridges to switch at very high speed.

The arrangement of the heat sink allows the busbars to be cooled efficiently. In addition, the arrangement of the semiconductor switching elements on the busbars means that a low thermal impedance can be achieved and the heat released by the switching elements can be effectively dissipated to the heat sink. Although the busbars are close together to influence the overall inductance of the commutation loop, busbars and switching elements can still be cooled effectively. In particular, the junction temperature of the switching elements can be kept at a desired value at high currents and high switching frequencies.

Instead of using printed circuit board layers to manufacture the busbars, copper plates can be used, for example, which are easy to bend and shape and are cheaper than thick copper circuit boards. Furthermore, the busbars can also be produced by welding onto a piece of metal such as copper, for example. The sizes and dimensions of the busbars can be chosen flexibly and freely and can be adapted to a given installation space, for example.

According to an embodiment, the second busbar has a plurality of contacts, these contacts being connected to the first section of the second busbar. Each of these contacts of the second busbar is electrically connected to a respective second terminal, for example to the respective source terminal, of the first semiconductor switching elements. In particular, the individual second terminals of the first switching elements are each connected to the respective contact of the second busbar with a material bond, for example in each case by a soldered connection or a sintered connection. These contacts are expediently connected at predetermined, equidistant distances from one another on that side or edge of the first section of the second busbar on which the respective second sections are also provided. Conveniently, one of the contacts is provided in each of the notches of the second busbar. Conveniently, the contacts each run perpendicular to the first section of the second busbar.

Conveniently, these contacts of the second busbar are each S-shaped or Z-shaped, in particular when viewed in a side view of the phase connection busbar. A first contact section of these individual S- or Z-shaped contacts is expediently connected in each case perpendicularly or at least substantially perpendicularly to the first section of the second busbar, in particular in each case in one of the respective notches between the respective second sections. Each of these first contact sections is adjoined, in particular perpendicularly or at least substantially perpendicularly, by a second contact section, which in particular runs parallel to the first section of the second busbar. This respective second contact section is adjoined, in particular vertically or at least essentially vertically, by a third contact section, which runs in particular parallel to the respective first contact section and perpendicular to the first section and to the second sections of the second busbar. In particular, this third contact section is used to make contact with the respective second terminal of the respective first semiconductor switching element. For this purpose, the individual third contact sections can each be connected to the respective second terminal, in particular by means of a material bond connection, in particular in each case a soldered or sintered connection.

According to an embodiment, the respective second terminal of the first semiconductor switching elements is in each case bent or kinked for connection to the respective contact of the second busbar. In particular, the respective second terminal is designed as a pin or wire, which is led out of the respective first semiconductor switching element, in particular parallel to its main extension plane, and is then bent or kinked accordingly, in particular by 90° or at least essentially by 90° relative to this main extension plane. The correspondingly bent or kinked section of the respective second terminal is electrically connected in particular to the respective third contact section of the in particular S-shaped or Z-shaped contact of the second busbar, e.g. by a soldered or sintered connection.

According to an embodiment, the third busbar has a first section and a plurality of contacts, these contacts being connected to the first section of the third busbar. Each of these contacts of the third busbar is electrically connected to a respective second terminal of the second semiconductor switching elements, for example to the respective source terminal. In particular, the individual second terminals or source terminals of the second switching elements are materially bonded to the respective contacts of the third busbar, for example by a soldered or sintered connection. This first section of the third busbar is in particular plate-shaped and arranged parallel to the respective first section and the respective second sections of the first busbar and second busbar. The contacts of the third busbar connect in particular to a first side or edge of the first section of the third busbar.

Conveniently, these contacts of the third busbar are each fork-shaped, U-shaped, V-shaped or Y-shaped, in particular when viewed in a plan view of the third busbar. A first contact section of these individual fork-shaped or Y-shaped contacts expediently adjoins the first section of the third busbar and, in particular, runs parallel to this first section or in the same plane as this first section. This respective first contact section is adjoined in particular by a second contact section that is U-shaped or V-shaped when viewed from above. In particular, this second contact section has legs that run parallel to the first section or in the same plane as the first section. This second contact section is used in each case for making contact with the respective second terminal or source terminal of the respective second semiconductor switching element, whereby these individual second contact sections can in each case be connected to the respective second terminal, for example by means of a soldered or sintered connection.

According to an embodiment, the respective second terminal of the second semiconductor switching elements is bent or kinked for connection to the respective contact of the third busbar. The respective second terminal is expediently provided as a pin, which is led out of the respective second semiconductor switching element parallel to the main extension plane and is then bent or kinked accordingly, in particular by 90° or at least substantially by 90° relative to this main extension plane. This bent or kinked section of the respective second terminal is expediently electrically connected to the respective second U- or V-shaped contact section of the in particular fork- or Y-shaped contact of the third busbar, e.g. by a soldered or sintered connection. The bent section of the respective second terminal is conveniently arranged between the legs of the U- or V-shaped contact of the third busbar.

According to an embodiment, the individual second sections of the first busbar are each connected to the respective first semiconductor switching element arranged thereon by a material bond, in particular in each case by a soldered or sintered connection, this material bond establishing an electrical connection between the respective first terminal of the respective first semiconductor switching element, for example the respective drain terminal, and the first busbar.

Alternatively or additionally, according to an embodiment, the individual second sections of the second busbar are each connected to the respective second semiconductor switching element arranged thereon by a material bond, in particular in each case by a soldered or sintered connection, with an electrical connection between the respective first terminal of the respective second semiconductor switching element, for example the respective drain terminal, and the second busbar being established in each case by this material bond.

The respective first terminal of the first and second semiconductor switching elements can be realized, for example, by a frame of the respective switching element and also by a pin connected to the frame. The electrical connection between the first terminal of the respective switching element and the first busbar or the second busbar is established in each case by the material bond between the frame or housing ("lead frame") of the respective switching element and the respective busbar. The separate pin of the individual switching elements can be conveniently cut off or removed. If the pin is required for protection and/or control purposes, it can also be retained and not removed. This material bond can create a stable electrical and mechanical connection between the respective switching element and the respective busbars and can reduce thermal resistance. Furthermore, a parasitic resistance of the respective pin can be reduced or eliminated by the material bond and electrical and mechanical connection.

According to an embodiment, the half-bridge switch arrangement further comprises a printed circuit board, wherein the printed circuit board is arranged perpendicularly or at least substantially perpendicularly to the respective first section and the respective second sections of the first busbar or the second busbar and furthermore, in particular, to the main extension plane or the first section of the third busbar. At least one third terminal of each of the first semiconductor switching elements and at least one third terminal of each of the second semiconductor switching elements are electrically connected to the printed circuit board. For example, each semiconductor switching element can have a gate terminal and a Kelvin terminal (also referred to as a Kelvin source terminal or auxiliary source terminal) as the at least one third terminal. Such a Kelvin source terminal can decouple the path of a load current from the path of a control current, which can lead to improved switching characteristics. For example, these third terminals are also each designed as a pin which is led out of the respective semiconductor switching element, in particular parallel to its main extension plane. In particular, the individual third terminals are each contacted with the printed circuit board by means of through-hole technology (THT) or pin-in-hole technology (PIH). For this purpose, the respective connection pin conveniently penetrates the printed circuit board through a corresponding connection opening, in particular in the form of a hole or bore in the printed circuit board, and is connected to the printed circuit board on a (rear) side of the printed circuit board facing away from the busbars, in particular by means of a soldered or sintered connection. In particular, the printed circuit board can also be cooled by the heat sink. It is not necessary to use the printed circuit board as a medium carrying the load current. In particular, the printed circuit board can be a power board for the power supply. The half-bridge switch arrangement can also have a logic board for logic control, which can be arranged parallel to the power board, for example on the side of the power board facing or facing away from the busbars.

According to an embodiment, at least one elevation is provided on a side of the heat sink facing the printed circuit board, whereby the printed circuit board is arranged on this at least one elevation. In particular, this at least one elevation serves to mechanically stabilize and cool the printed circuit board. The at least one elevation can be provided in particular in the form of a pedestal or base and can, for example, be rectangular in shape or rectangular in cross-section. In particular, the printed circuit board sits or lies directly on the at least one elevation. It is therefore expedient to use this at least one elevation to create thermal contact between the printed circuit board and the heat sink, so that the printed circuit board can also be effectively cooled by the heat sink.

According to an embodiment, the half-bridge switch arrangement also has a capacitor unit, which in turn has at least one discrete capacitor element, in particular a plurality of parallel-connected, discrete capacitor elements. The capacitor unit is arranged on a side or surface of the third busbar that faces away from the arrangement comprising the first busbar and the second busbar. This capacitor unit or its capacitor elements are in particular DC link capacitors. For example, the capacitor unit can provide primary DC link capacitors, which are connected in parallel to the entire parallel connection of the half bridges, and/or secondary or distributed DC link capacitors, which are connected in parallel to individual half bridges. A combination of primary and secondary DC link capacitors can reduce the inductance of the commutation loop in particular. The use of discrete capacitor elements in the capacitor unit offers a high degree of flexibility and scalability for the design of the primary and/or secondary DC link in order to achieve a desired power, voltage and current ripple. The design and shape of the busbars can suitably provide sufficient space for these DC link capacitors, which can reduce the inductance of the commutation loop. By placing the DC link capacitors as close as possible to the switching elements, inductance in particular can be reduced. The commutation loop can be optimized due to the short distances between the lines of the switching elements, the busbars and the capacitor unit. The positioning of the capacitor unit and its connection to the busbars is easy to implement during the manufacturing process. In particular, the distance between the DC link capacitors and the switching elements can be as symmetrical as possible. The capacitor unit can be effectively cooled by the heat sink. For example, the capacitor unit can be cuboid in shape and have, for example, a special cuboid capacitor element or a large number of discrete capacitor elements arranged in a cuboid housing.

According to an embodiment, at least one first terminal of the capacitor unit is electrically connected to the first busbar. For this purpose, the first busbar has at least one contact to which the at least one first terminal of the capacitor unit is electrically connected. Conveniently, this at least one contact is provided on a side of the first busbar that is opposite the respective second sections. In particular, a plurality of such contacts can be provided, in particular at equidistant distances from one another. In particular, a third section can be connected vertically or at least substantially vertically to the side of the first section of the first busbar opposite the respective second sections. This third section can in turn be followed perpendicularly or at least essentially perpendicularly by a fourth section, which in turn runs parallel to the first section. The first busbar can therefore have a step or be S-shaped or Z-shaped in cross-section. The at least one contact can connect to this fourth connection parallel to it.

The at least one contact is in particular fork-shaped, U-shaped, V-shaped or Y-shaped, in particular when viewed from above on the first busbar. For example, a first contact section of such a fork-shaped or Y-shaped contact is connected to the first busbar, in particular to its fourth section, preferably parallel to the fourth section. This first contact section is followed in particular by a U-shaped or V-shaped second contact section, viewed from above, with legs running parallel to the fourth section, which is used for electrical connection to the first terminal of the capacitor unit, e.g. by means of a soldered or sintered connection. The first contact section and the U-shaped or V-shaped second contact section together form the fork-shaped or Y-shaped contact.

According to an embodiment, at least a second terminal of the capacitor unit is electrically connected to the third busbar. For this purpose, the third busbar has at least one connection opening, e.g. in the form of a hole or bore, on its side or surface facing away from the arrangement of the first busbar and the second busbar. The at least one second terminal of the capacitor unit is electrically connected to the at least one connection opening of the third busbar. For example, the second terminals of the capacitor unit can each be designed as a pin which penetrates the connection opening in the third busbar and is connected to the third busbar with a material bond on the side of the busbar facing the arrangement of the first busbar and the second busbar, in particular by means of a soldered or sintered connection (e.g. through-hole technology, THT).

According to an embodiment, the half-bridge switch arrangement further comprises at least one first electrical heat sink insulating layer, wherein the arrangement comprising the first busbar and the second busbar is electrically insulated from the heat sink by this at least one first electrical heat sink insulating layer. This at least one first electrical heat sink insulating layer is arranged on a side or surface of the second sections of the first busbar facing away from the first semiconductor switching elements and/or on a side or surface of the second sections of the second busbar facing away from the second semiconductor switching elements. For example, a separate first electrical heat sink insulating layer can be provided for each second section of both the first busbar and the second busbar. A common first heat sink insulating layer can also be provided for several or all second sections of the first busbar and the second busbar.

According to an embodiment, the half-bridge switch arrangement further comprises at least one second electrical heat sink insulating layer, wherein the first busbar is electrically insulated from the heat sink by the at least one second electrical heat sink insulating layer, and wherein the at least one second electrical heat sink insulating layer is arranged between the first busbar and the heat sink. As explained, the first busbar can, for example, have a step or be S-shaped or Z-shaped in cross-section with a third section and a fourth section. For example, the second electrical heat sink insulating layer can be arranged between this fourth section and the heat sink.

The first electrical heat sink insulating layer and the second electrical heat sink insulating layer can, for example, each be made of metallized ceramic or a ceramic material, e.g. aluminium oxide ($Al_2O_3$), aluminium nitride (AlN) or silicon nitride ($Si_3N_4$). Such a ceramic layer has a low thermal resistance compared to other conventional thermal interface materials. Conveniently, the first and second heat sink insulating layers each represent a thermal interface material (TIM) between the respective busbar and the heat sink and can each a low thermal resistance or a high thermal conductivity. The thermal resistance between the switching elements, the busbars and the heat sink can therefore be reduced so that heat can be dissipated effectively.

Such switching element or heat sink insulating layers made of ceramic materials have a significantly higher robustness and service life compared to plastics, for example, when exposed to alternating electric fields. Stresses on the insulating layers can be caused in particular by the use of fast-switching semiconductors due to high switching frequencies and high edge steepnesses.

According to an embodiment, the half-bridge switch arrangement also has a retaining element, this retaining element being arranged between the third busbar and the arrangement comprising the first busbar and the second busbar. The retaining element is designed to press the arrangement comprising the first busbar and the second busbar against the heat sink and, in particular, to hold the arrangement comprising the third busbar, the first busbar, the second busbar and the heat sink together. For this purpose, the retaining element can be fastened to the heat sink in particular by means of a fastening mechanism, e.g. by means of screws. The third busbar and the arrangement comprising the first busbar and the second busbar are also conveniently electrically insulated from one another by the retaining element.

The half-bridge switch arrangement can be used in particular in a power converter or a power converter circuit, for example in an inverter or inverter for alternating conversion between direct and alternating voltages, whereby a parallel connection of half-bridges can usefully be provided for one phase each of a multi-phase alternating voltage. For this purpose, the first busbar and the third busbar can each be electrically connected to a DC voltage terminal, for example, and the second busbar to an AC voltage terminal.

In particular, the half-bridge switch arrangement is suitable for use in a (motor) vehicle, for example to convert a voltage between a DC on-board power supply and an electrical machine that can be operated with a multi-phase AC voltage. By connecting the half-bridges in parallel, the desired power or current levels can be achieved, particularly in high-power converters in the vehicle sector. For this purpose, the first busbar and the third busbar can be connected to the DC vehicle electrical system, and the second busbar to a phase of the electrical machine. The half-bridge switch arrangement or its parallel connection of the individual half-bridges can thus be provided in particular for one phase of the electrical machine. In a corresponding multiphase inverter of a vehicle, a corresponding number of half-bridge switch arrangements can be provided accordingly, e.g. three half-bridge switch arrangements for a three-phase electrical machine.

Further advantages and embodiments of the disclosure are shown in the description and the accompanying drawing.

The disclosure is illustrated schematically in the drawing by means of embodiment examples and is described below with reference to the drawing.

BRIEF DESCRIPTION OF THE DRAWINGS

FIGS. 2a-2g schematically show a half-bridge switch arrangement, in embodiments.

DETAILED DESCRIPTION

Figure 1:
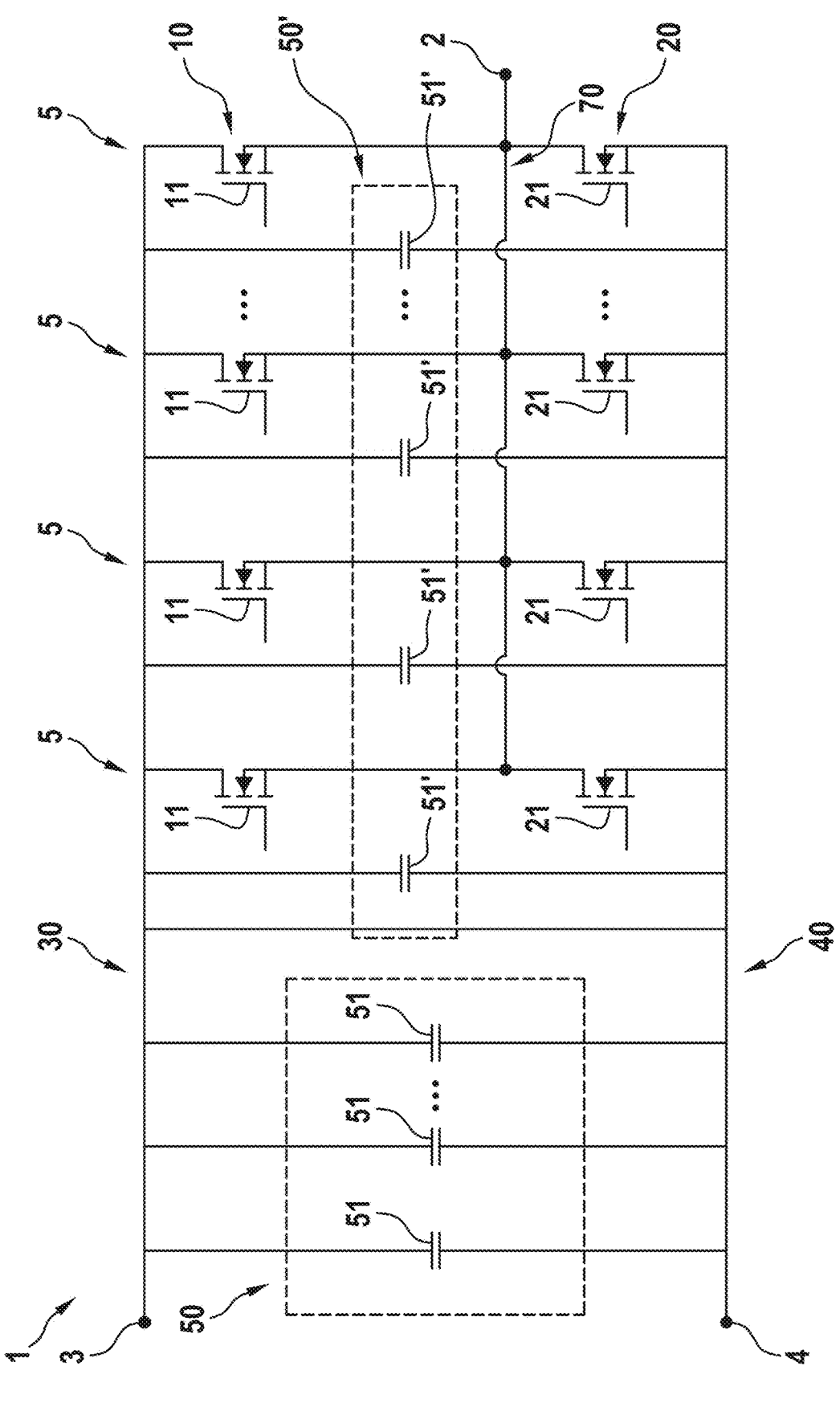
FIG. 1 schematically shows a half-bridge switch arrangement according to the disclosure as an electrical circuit diagram, in embodiments.

FIG. 1 schematically illustrates an embodiment of a half-bridge switch arrangement 1 according to the disclosure as an electrical circuit diagram.

The half-bridge switch arrangement 1 is provided for rectification or alternating direction between DC voltage terminals 3, 4 and an AC voltage terminal 2 and has a plurality of parallel-connected half-bridges 5, each of which has a discrete first semiconductor switching element 11 and a discrete second semiconductor switching element 21, e.g. each in the form of a metal-oxide-semiconductor field-effect transistor (MOSFET) or an insulated-gate bipolar transistor (IGBT). The first semiconductor switching elements 11 of these parallel-connected half-bridges 5 form a high-side switch 10 and the second semiconductor switching elements 21 of these parallel-connected half-bridges 5 form a low-side switch 20. The number of parallel-connected half-bridges 5 and thus the number of individual first and second semiconductor switching elements 11 and 21 can each be selected in such a way as to achieve a desired power or a desired current.

The half-bridge switch arrangement 1 also has a positive busbar 30 as the first busbar, a negative busbar 40 as the second busbar and a phase connection busbar 70 as the third busbar. A drain terminal (first terminal) of each of the first semiconductor switching elements 11 is electrically connected to the positive busbar 30. A source terminal (second terminal) of each of the first semiconductor switching elements 11 is electrically connected to the phase connection busbar 70. Furthermore, a drain terminal (first terminal) of each of the individual second semiconductor switching elements 21 is also electrically connected to the phase connection busbar 70. A source terminal (second terminal) of each of the second semiconductor switching elements 21 is electrically connected to the negative busbar 40.

Furthermore, a plurality of first capacitor elements 51 is provided as a primary DC link capacitor 50, wherein these first capacitor elements 51 are each connected in parallel with the parallel connection of the individual half bridges 5. A plurality of second capacitor elements 51' is provided as a secondary or distributed DC link capacitor 50', one of these second capacitor elements 51' being connected in parallel with one of the half bridges 5 in each case.

For example, the arrangement 1 can be used in a (motor) vehicle, wherein the DC voltage terminals 3, 4 can be connected, for example, to a DC on-board power supply, and wherein a phase of an electrical machine can be connected to the AC voltage terminal 2, for example. The electrical machine can be a multi-phase machine, e.g. with typically three or more phases. For each of the phases, a half-bridge switch arrangement is provided in particular, as shown in FIG. 1, with a plurality of parallel-connected half-bridges 5. Furthermore, in particular a control unit for controlling the individual switching elements 11, 21 can be provided, wherein the control unit can control the gate terminals of the switching elements 11, 21 in such a way that a direct or alternating direction of the current takes place.

FIGS. 2a to 2g schematically illustrate an embodiment of a half-bridge switch arrangement according to the disclosure in various views, each labeled 100. For better orientation, a coordinate system is shown in each case.

Figure 2A:
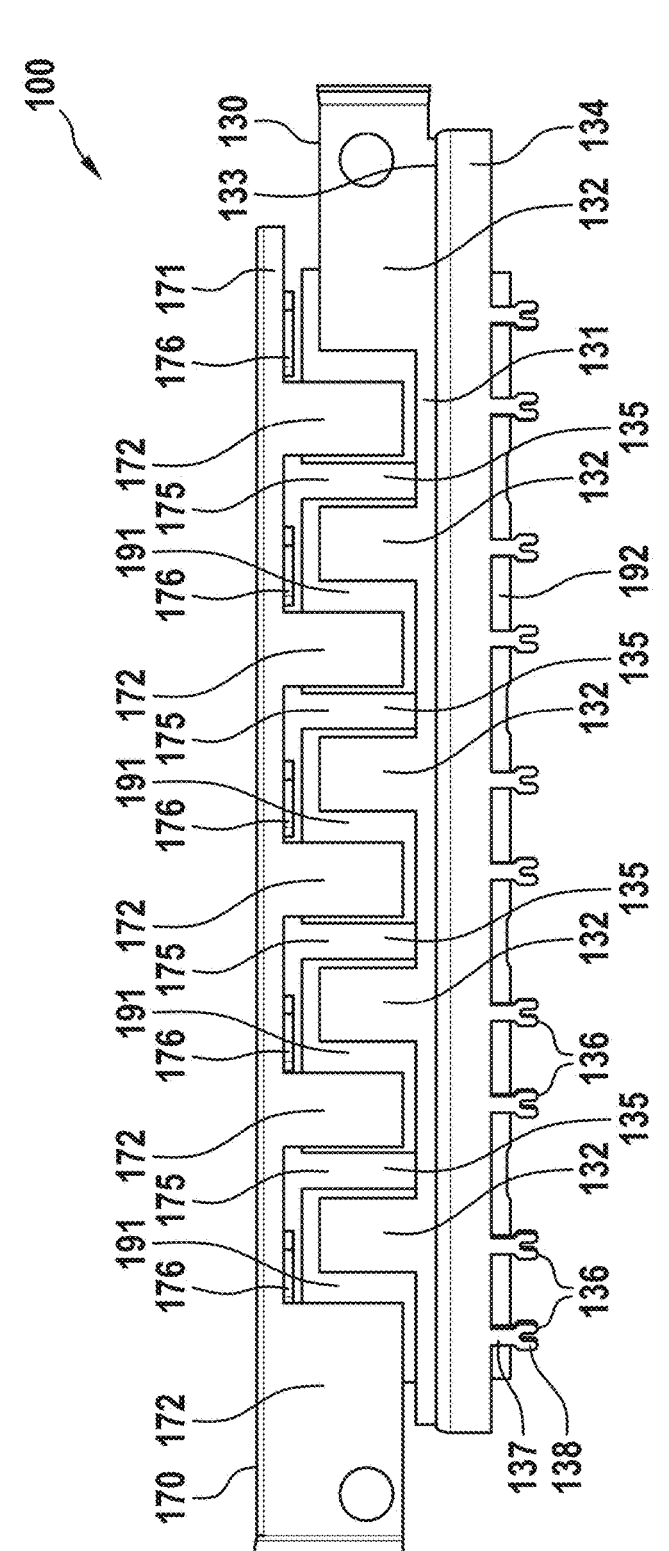
Figure 2A:
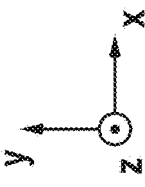

In FIG. 2a, a part of the half-bridge switch arrangement 100 is shown schematically in a plan view along a z-axis on an x/y-plane.

In accordance with the electrical circuit diagram shown in FIG. 1, the half-bridge switch arrangement 100 has a positive busbar 130 and a phase connection busbar 170. The x/y plane also represents a main extension plane of the busbars.

As shown in FIG. 2a, a first busbar 130, for example here the positive busbar, is comb-shaped and has a first, in particular plate-shaped section 131 and a plurality of second sections 132, in each case in particular plate-shaped, which each adjoin the same section 131 at equidistant distances from one another on a first side or edge of the first section 131, so that a notch 135 is provided between each of the individual second sections 132.

A second busbar 170, for example here the phase connection busbar, is also comb-shaped and has a first, in particular plate-shaped section 171 and a plurality of second sections 172, in each case in particular plate-shaped. These second sections 172 each adjoin a first side or edge of the first section 171 of the phase connection busbar 170 at equidistant distances from one another, so that a notch 175 is provided between each of the individual second sections 172 of the phase connection busbar 170.

In the following, a z-direction oriented perpendicular to the respective first section 131, 171 and the respective second sections 132, 172 of the positive busbar 130 and the phase connection busbar 170 is also referred to as the height direction. In particular, this z-direction points vertically out of the drawing plane of FIG. 2a. An x-direction oriented perpendicular to the z-direction is also referred to as the longitudinal direction. A y-direction oriented perpendicular to both the z-direction and the x-direction is also referred to as the width direction.

The positive busbar 130 and the output phase busbar 170 are arranged relative to each other such that that the second sections 172 of the phase connection busbar 170 are arranged within the notches 135 between the second sections 132 of the positive busbar 130 in a projection onto the main plane of extension of the positive busbar 130, and that the second sections 132 of the positive busbar 130 are arranged within the notches 175 between the second sections 172 of the phase connection busbar 170 in a projection onto the main plane of extension of the phase connection busbar 170.

For example, the first section 131 of the positive busbar 130 is arranged above or at least slightly upwardly offset from the first section 171 of the phase connection busbar 170 when viewed in the z-direction or height direction. For example, the first section 131 of the positive busbar 130 is arranged above or at least slightly upwardly offset from the first section 171 of the phase connection busbar 170 when viewed in the z-direction or height direction, so that the second sections 132 of the positive busbar 130 are located above or at least slightly upwardly offset from the notches 175 of the phase connection busbar when viewed in the z-direction, and so that correspondingly the second sections 172 of the phase connection busbar 170 are located below or at least slightly downwardly offset from the notches 135 of the positive busbar 130 when viewed in the height direction.

As viewed in the z-direction, a plurality of first electrical heat sink insulating layers 191 are provided below the second sections 132 of the positive busbar 130 and the second sections 172 of the output phase busbar 170, wherein one such heat sink insulating layer 191 is provided in common for each of one of the second sections 132 of the positive busbar 130 and of the second sections 172 of the output phase busbar 170.

In the example shown, the positive busbar 130 also has a third section 133 and a fourth section 134, this third section 133 being connected vertically or at least substantially vertically to a side of the first section 131 opposite the respective second sections 132. The third section 133 thus runs in the z-direction. This third section 133 is adjoined vertically or at least substantially vertically by the fourth section 134, which in turn runs parallel to the first section 131. The positive busbar 130 thus has a step or is S-shaped or Z-shaped in cross-section.

Viewed in the z-direction, a second electrical heat sink insulating layer 192 is provided below the fourth section 134 of the positive busbar 130.

The positive busbar 130 also has a plurality of contacts 136, which are provided on a side of the positive busbar 130 opposite the respective second sections 132, for example on a side of the fourth section 134 opposite the second sections 132. These contacts 136 are each for example fork-shaped or Y-shaped when viewed from above, with a first contact section 137 of each contact 136 adjoining the fourth section 134 parallel to the latter. This first contact section 137 is adjoined in each case by a second contact section 138, which is U-shaped or V-shaped when viewed from above, with legs extending parallel to the fourth section 134.

Furthermore, the phase connection busbar 170 also has a plurality of contacts 176, each of which is connected to the first section 171, in particular in one of the notches 175. In particular, these contacts 176 each extend in the z-direction and thus perpendicular to the first section 171 and the second sections 172 of the phase connection busbar 170. These contacts 176 are explained in detail below with reference to FIG. 2c.

Figure 2B:
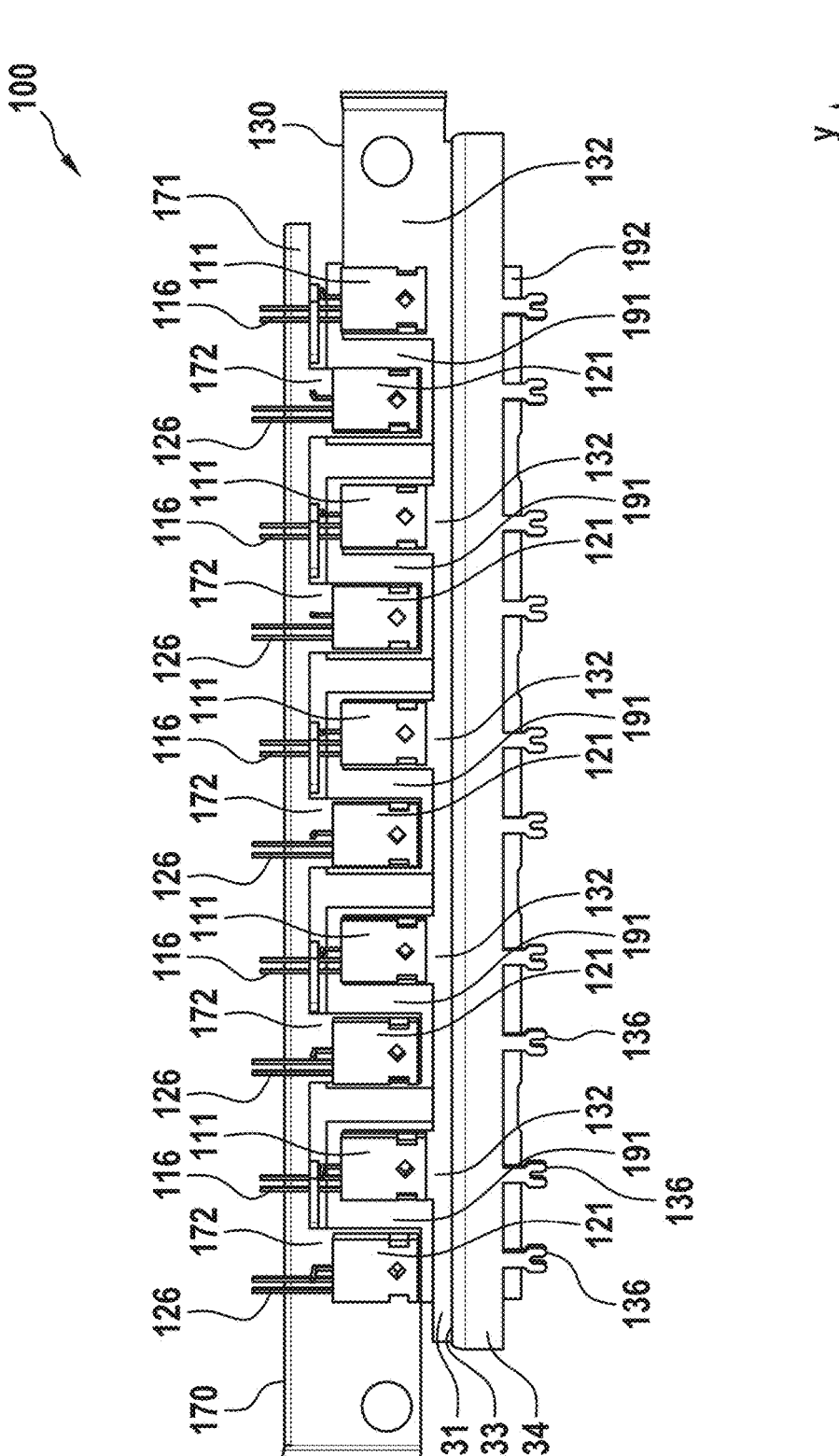

FIG. 2b shows a schematic top view of a part of the half-bridge switch arrangement 100 corresponding to FIG. 2a.

In accordance with the electrical circuit diagram shown in FIG. 1, the half-bridge switch arrangement 100 has a plurality of parallel-connected half-bridges, each of which has a discrete first semiconductor switching element 111 and a discrete second semiconductor switching element 121, for example each in the form of a MOSFET or IGBT. The half-bridge switch arrangement 100 thus has a plurality of first semiconductor switching elements 111, which here form a high-side switch, and a plurality of second semiconductor switching elements 121, which here form a low-side switch.

As can be seen in FIG. 2b, one of the first semiconductor switching elements 111 is arranged at each of the second sections 132 of the positive busbar 130, in particular on an upper side of the respective second section 132 as viewed in the z-direction. Furthermore, one of the second semiconductor switching elements 121 is arranged at each of the second sections 172 of the phase connection busbar 170, in particular on an upper side of the respective second section 172 as viewed in the z-direction.

In FIG. 2b, five first and second semiconductor switching elements 111 or 121 and thus five half-bridges connected in parallel are provided in each case as an example, but the number of semiconductor switching elements can also be larger or smaller, in particular depending on the desired power or desired current that is to flow through the semiconductor switching elements in total. Accordingly, the positive busbar 130 and the output phase busbar 170 may each have more or less than five second sections 132 and 172, respectively.

A respective first terminal, for example a respective drain terminal, of the individual first semiconductor switching elements 111 is in each case electrically connected to the positive busbar 130. For this purpose, the individual second sections 132 of the positive busbar 130 are each connected by soldering or sintering to the respective first semiconductor switching element 111 arranged thereon, the electrical connection between the respective drain terminal of the respective first semiconductor switching element 111 and the positive busbar 130 being established in each case by this soldering or sintering connection.

Accordingly, a respective first terminal, for example a respective drain terminal, of the individual second semiconductor switching elements 121 is electrically connected in each case to the phase connection busbar 170. For this purpose, the individual second sections 172 of the phase connection busbar 170 are each connected to the respective second semiconductor switching element 121 arranged thereon by a soldered or sintered connection, with the electrical connection between the respective drain terminal of the respective second semiconductor switching element 121 and the phase connection busbar 170 being established by this soldered or sintered connection in each case.

The respective drain terminal of the first and second semiconductor switching elements 111, 121 can each be realized, for example, by a frame of the respective switching element 111, 121, so that the corresponding electrical connection to the drain terminal is established by the respective soldered or sintered connection between the frame or housing of the respective switching element 111, 121 and the respective busbar 130, 170. A separate drain pin connected to the frame can, for example, be cut off or removed.

At least one third terminal 116 of each of the first semiconductor switching elements 111 and at least one third terminal 126 of each of the second semiconductor switching elements 121 is electrically connected to a printed circuit board, as explained further below with reference to FIGS. 2f and 2g. For example, each of the semiconductor switching elements 111, 121 may each have a gate terminal and a Kelvin source terminal as such third terminals.

Furthermore, a respective second terminal, for example a respective source terminal, of the first semiconductor switching elements 111 is in each case electrically connected to the phase connection busbar 170, and a respective second terminal, for example a respective source terminal, of the second semiconductor switching elements 121 is in each case electrically connected to a third, here negative, busbar 140, as will be explained below with reference to FIG. 2c.

Figure 2C:
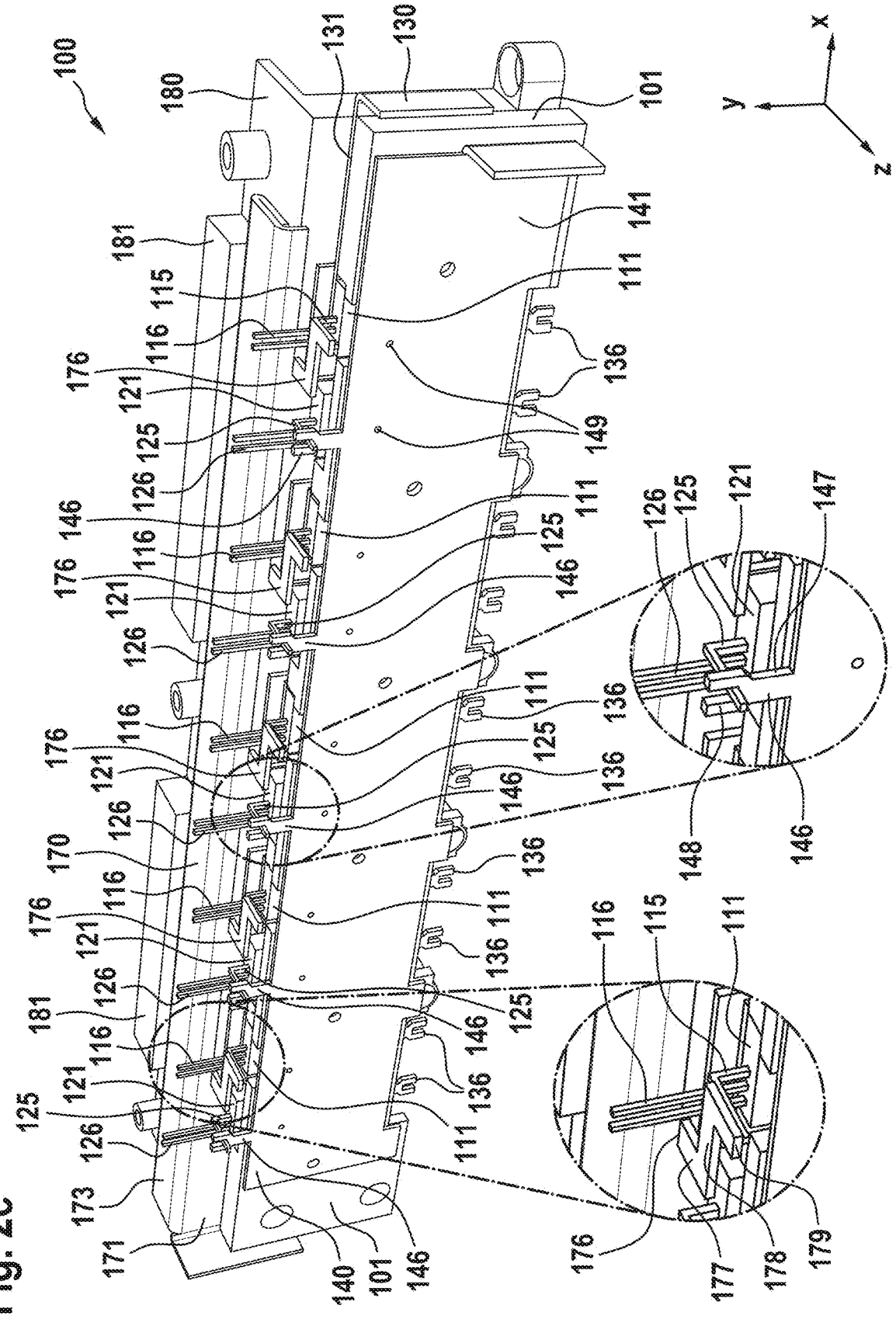

FIG. 2c schematically shows a part of the half-bridge switch arrangement 100 in a perspective view.

As shown in FIG. 2c, the half-bridge switch arrangement 100 further comprises a third busbar 140, for example a negative busbar 140, and a heat sink 180.

The negative busbar 140 is arranged on a first side of the arrangement comprising the positive busbar 130 and the output-phase busbar 170, which comprises the first semiconductor switching elements 111 and the second semiconductor switching elements 121, in particular above the positive busbar 130 when viewed in the z-direction.

The heat sink 180 is arranged on a second side of the arrangement comprising the positive busbar 130 and the output-phase busbar 170 opposite the first side, in particular below the output-phase busbar 170 when viewed in the z-direction.

The arrangement comprising the positive busbar 130 and the output phase busbar 170, in particular the respective second sections 132 and 172, are electrically insulated from the heat sink 180 by the first electrical heat sink insulating layers 191. Furthermore, the positive busbar 130, in particular the fourth section 134 thereof, is electrically insulated from the heat sink 180 by the second electrical heat sink insulating layer 192. The individual first heat sink insulating layers 191 and the second heat sink insulating layer 192 can each be made of metallized ceramic or a ceramic material, for example aluminum oxide ($Al_2O_3$), aluminum nitride (AlN) or silicon nitride ($Si_3N_4$).

An outer surface of each of the individual first and second semiconductor switching elements 111, 121 is in thermal contact with the positive busbar 130 and the output phase busbar 170, respectively. The individual busbars 130, 140, 170 are each in thermal contact with the heat sink 180. This means that heat from the individual switching elements 111, 121 and the individual busbars 130, 140, 170 can be effectively transferred to the heat sink and dissipated from it. The special (comb) shape of the positive busbar 130 and the phase connection busbar 170 can facilitate the connection of the individual semiconductor switching elements 111, 121 and improve the electrical conductivity as well as the heat transfer from the switching elements 111, 121 to the heat sink 180.

As can be seen in FIG. 2c, the phase connection busbar 170 may further comprise a third section 173 which connects vertically or at least substantially vertically to a side of the first section 171 opposite the respective second sections 172. This third section 173 thus runs parallel to the z-axis.

A retaining element 101 is arranged between the negative busbar 140 and the arrangement comprising the positive busbar 130 and the output-phase busbar 170, in particular between the negative and the positive busbar 140, 130. This retaining element 101 is designed to press the arrangement comprising the positive busbar 130 and the phase connection busbar 170 against the heat sink 180, and also to hold the arrangement comprising the negative busbar 140, the positive busbar 130, the phase connection busbar 170 and the heat sink 180 together. For example, the retaining element 101 may be secured to the heat sink 180 by means of a fastening mechanism, such as screws. Furthermore, the negative busbar 140 and the arrangement comprising the positive busbar 130 and the phase connection busbar 170, in particular the negative and positive busbars 140, 130, are electrically insulated from each other by the retaining element 101.

The negative busbar 140 has a first section 141, which is in particular plate-shaped, and a plurality of contacts 146, which are connected to the first section 141. This first section 141 of the negative busbar 140 is arranged in particular parallel to the respective first section 131, 171 and the respective second sections 132, 172 of the positive busbar 130 and the phase connection busbar 170.

The individual contacts 146 of the negative busbar 140 are each fork-shaped or Y-shaped when viewed in a plan view of the negative busbar 140. A first contact section 147 of these individual fork-shaped or Y-shaped contacts 146 adjoins the first section 141 of the negative busbar 140 and runs parallel to this first section 141 in the same plane as this first section 141. This respective first contact section 147 is adjoined in each case by a U-shaped or V-shaped second contact section 148 with legs running parallel to the first section 141, as viewed from above.

These contacts 147 of the negative busbar 140 are provided in particular to electrically connect a second terminal 125 of the second semiconductor switching elements 121, for example a source terminal in each case, to the negative busbar 140. For this purpose, for example, each source terminal 125 of the second semiconductor switching elements 121 is bent or kinked for connection to one of the contacts 147 of the negative busbar 140, for example in each case by 90° or at least substantially by 90° relative to a main extension plane of the respective semiconductor switching element 121. This bent or kinked section of the respective source terminal 125 is electrically connected to the second U-shaped or V-shaped contact section 148 of the respective contact 146 of the negative busbar 140, for example by a soldered or sintered connection.

As explained above with reference to FIG. 2a, the phase connection busbar 170 has a plurality of contacts 176. As shown in FIG. 2c, these contacts 176 can each be, for example, S-shaped or Z-shaped, viewed in a side view of the phase connection busbar 170. In each case, a first contact section 177 of these individual S-shaped or Z-shaped contacts 176 adjoins, for example, perpendicularly or at least substantially perpendicularly to the first section 171 of the phase connection busbar 170, in particular in each case in one of the respective notches 175 between the respective second sections 172. Each of these first contact sections 177 is adjoined, for example perpendicularly or at least substantially perpendicularly, by a second contact section 178, which runs, for example, parallel to the first section 171 of the phase connection busbar 170. This respective second contact section 178 is adjoined in each case, for example perpendicularly or at least substantially perpendicularly, by a third contact section 179, which extends, for example, parallel to the respective first contact section 177 and perpendicularly to the first section 171 and to the second sections 172 of the phase connection busbar 170.

These contacts 176 of the phase connection busbar 170 are provided in particular to electrically connect a respective second terminal 115 of the first semiconductor switching elements 111, for example a respective source terminal, to the phase connection busbar 170. For this purpose, for example, each source terminal 115 of the first semiconductor switching elements 111 is bent or kinked for connection to one of the contacts 176 of the phase connection busbar 170, for example in each case by 90° or at least substantially by 90° relative to a main extension plane of the respective semiconductor switching element 111. This bent or kinked section of the respective source terminal 115 is electrically connected to the third contact section 179 of the respective contact 176 of the phase connection busbar 170, for example by a soldered or sintered connection.

As shown in FIG. 2c, the heat sink 180 has pedestal-like or base-like elevations 181. These elevations 181 are provided for mechanical stabilization and cooling of a printed circuit board, as will be explained below with reference to FIGS. 2f and 2g.

The negative busbar 140 has a plurality of connection openings 149 on its side or surface facing away from the arrangement of the positive busbar 130 and the phase connection busbar 170, for example each in the form of a hole or bore. These connection openings 149 of the negative busbar 140 as well as, for example, the Y-shaped or fork-shaped contacts 136 of the positive busbar 130 are provided in order to electrically connect the negative busbar 140 and the positive busbar 130 to DC link capacitors, as will be explained below with reference to FIGS. 2d and 2e.

Figure 2D:
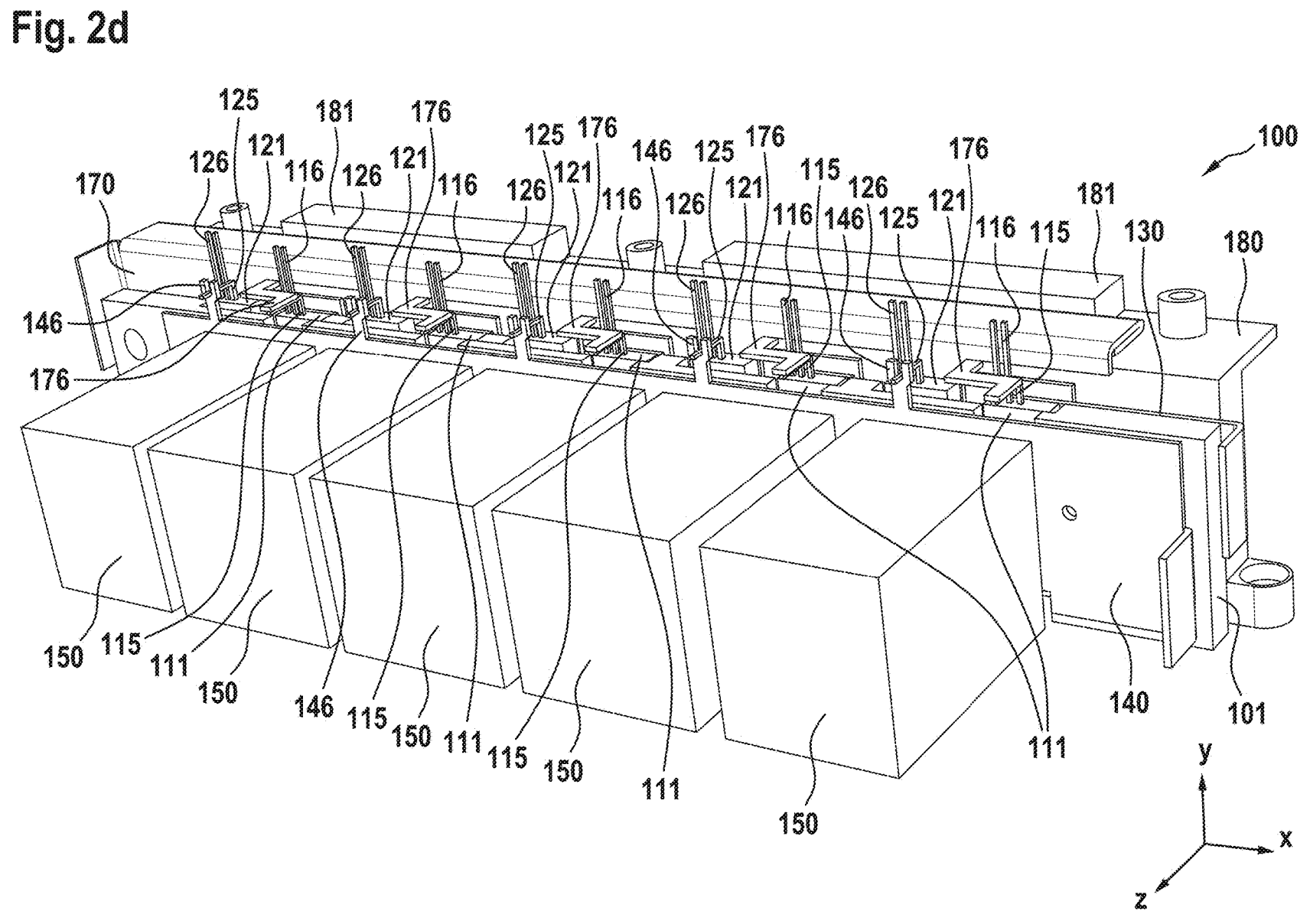
Figure 2E:
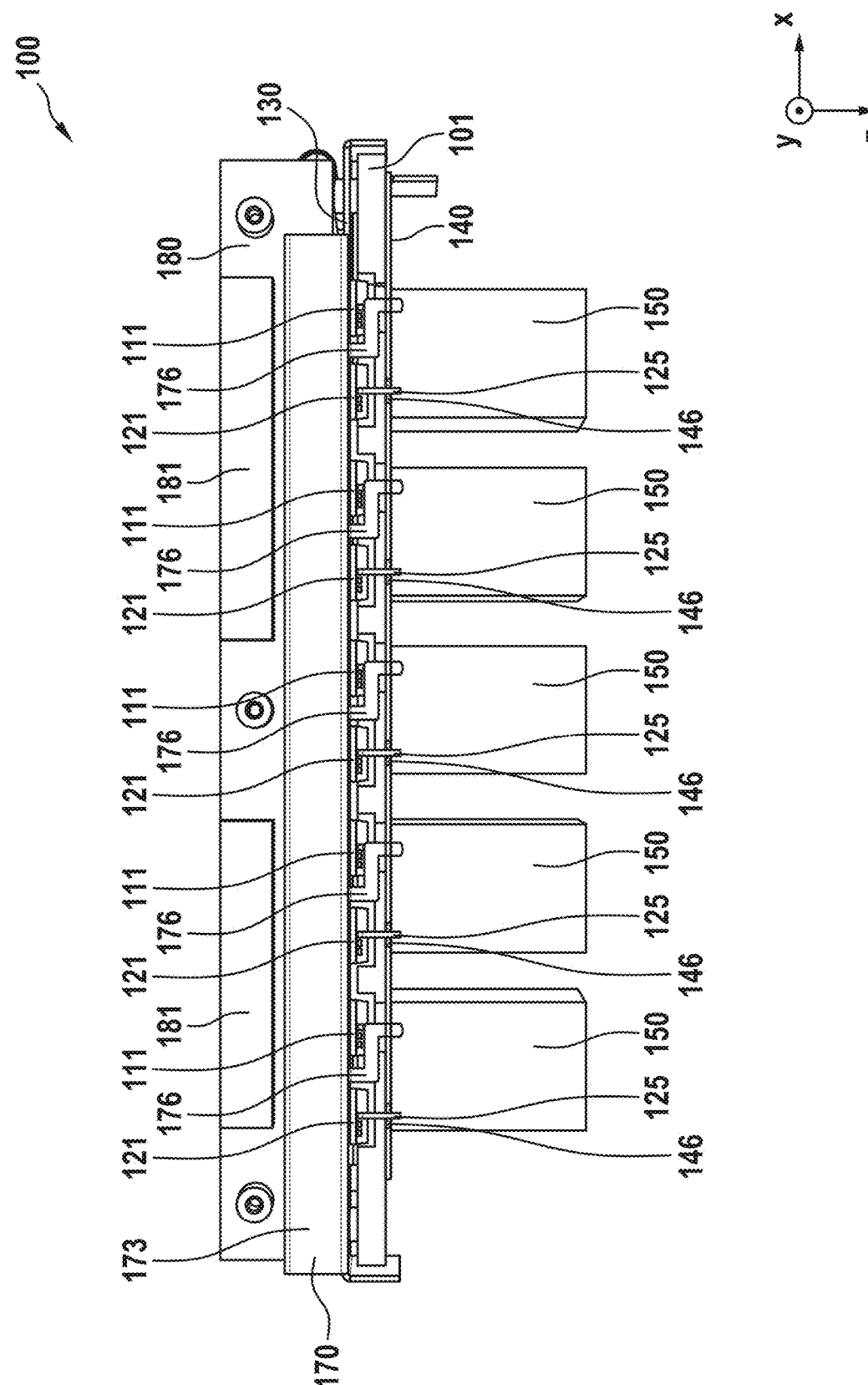

A part of the half-bridge switch arrangement 100 is shown schematically in a perspective view in FIG. 2d and in a side view in FIG. 2e.

As shown in FIGS. 2d and 2e, the half-bridge switch arrangement 100 further comprises a plurality of capacitor units 150, each of which is arranged on the side of the negative busbar 140 facing away from the arrangement comprising the positive busbar 130 and the phase connection busbar 170.

Each of these capacitor units 150 has at least one discrete capacitor element. These capacitor units 150 or their individual capacitor elements each represent, in particular, DC link capacitors. For example, each of the capacitor units 150 can provide primary DC link capacitors and/or secondary or distributed DC link capacitors.

A respective first terminal of the individual capacitor units 150 is in each case electrically connected to the positive busbar 130, in particular in each case to one of the contacts 136 of the positive busbars. For this purpose, the respective first terminal of the respective capacitor unit 150 can, for example, be electrically and mechanically connected to the U-shaped or V-shaped second contact section 138 of the respective contact 136, for example by means of a soldered or sintered connection.

A respective second terminal of the individual capacitor units 150 is in each case electrically connected to the negative busbar 140, in particular in each case to one of the connection openings 149 of the negative busbars 140. For this purpose, for example, the respective second terminal of the respective capacitor unit 150 can penetrate the respective connection opening 149 as a pin and be connected to the negative busbar 140 on the side facing the arrangement comprising the positive busbar 130 and the phase connection busbar 170 by a soldered or sintered connection.

In the example shown, five DC capacitors connected in parallel are provided, but the number of capacitor elements can also be smaller or larger. The size of the DC link can depend in particular on several factors, e.g. the output current or output power of the inverter, the variation of the modulation index, the required voltage ripple and the ripple current carrying capacity of the individual capacitors. The number of parallel capacitors can be changed depending on the application. The half-bridge switch arrangement 100 provides flexibility to scale the DC link at different power levels. The number of parallel capacitors can differ from the number of parallel half bridges. The arrangement of the capacitors is very close to the half-bridge, which reduces the inductance of the commutation loop. The capacitors can be cooled by contact with the housing of the inverter via a surface material or a filler, which additionally improves the cooling of the DC link.

Figure 2F:
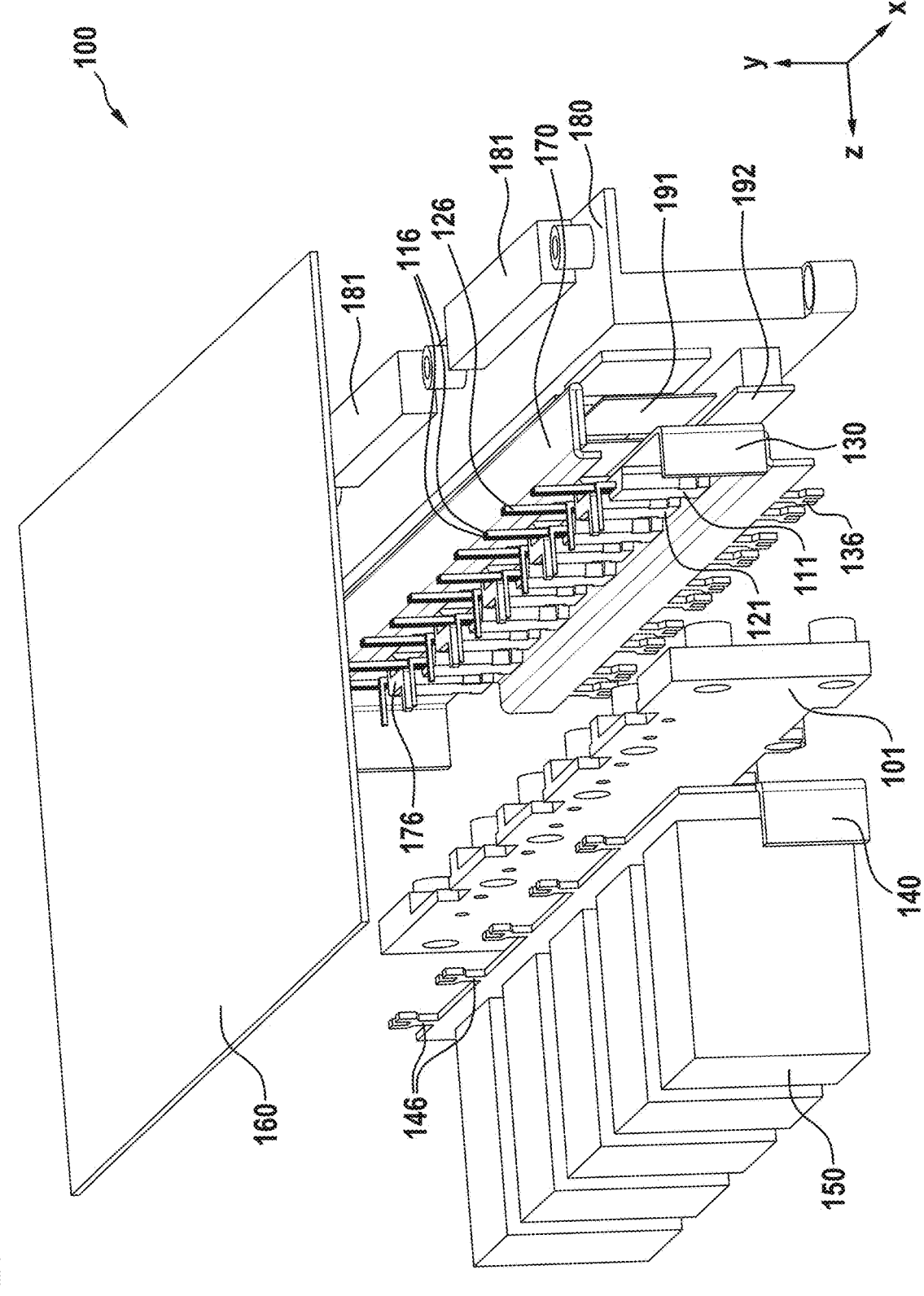

FIG. 2*f* shows the half-bridge switch arrangement 100 in a schematic exploded view. FIG. 2*g* shows a schematic top view of the half-bridge switch arrangement 100.

Figure 2G:
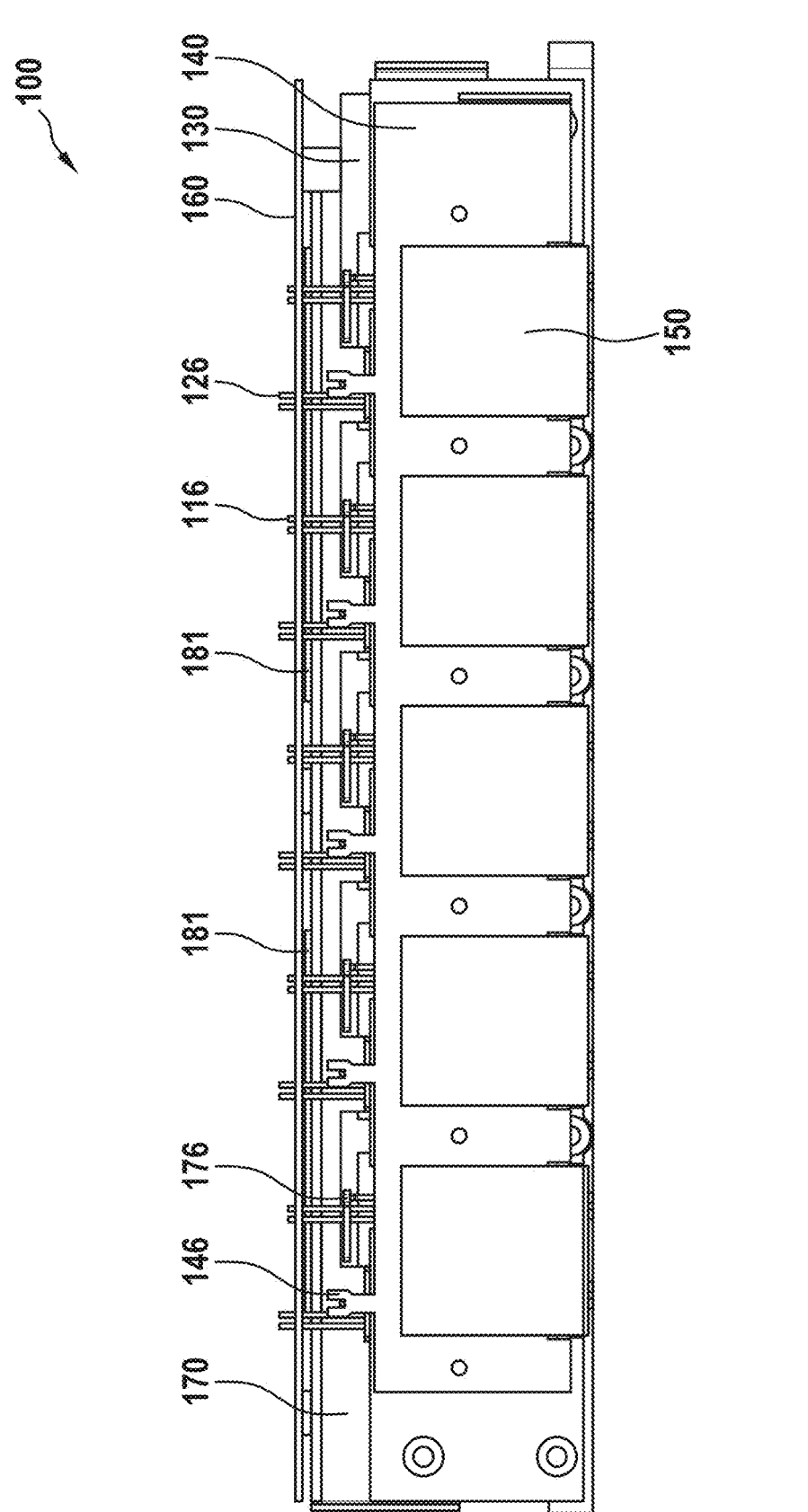

As shown in FIGS. 2*f* and 2*g*, the half-bridge switch arrangement 100 further comprises a printed circuit board 160.

The printed circuit board 160 is arranged perpendicular or at least substantially perpendicular to the respective first section 131, 171 and the respective second sections 132, 172 of the positive busbar 130 or the phase connection busbar 170, and furthermore in particular perpendicular to the main extension plane or the first section 141 of the negative busbar 140. The printed circuit board 160 sits or lies, for example, directly on the elevations 181 of the heat sink 180. In this way, thermal contact is established between the printed circuit board 160 and the heat sink 180, so that the printed circuit board 160 can also be effectively cooled by the heat sink 180.

As can be seen in particular in FIG. 2*g*, respective third terminals 116 and 126 of the first and second semiconductor switching elements 111 and 121 respectively, for example a gate terminal and a Kelvin source terminal respectively, are electrically connected to the printed circuit board 160 in that these connections, which are each formed as a pin, penetrate the printed circuit board 160 through a corresponding connection opening and are connected to the printed circuit board 160 by a solder or sintered connection on a side facing away from the busbars 130, 140, 170.

The half-bridge switch arrangement 100 according to the embodiment of the disclosure shown in FIGS. 2*a* to 2*g* has a low DC link inductance and a low thermal impedance and can be cooled effectively.

The invention claimed is:

1. Half-bridge switch arrangement (1, 100) having a plurality of parallel-connected half-bridges (5), each half-bridge (5) having a first semiconductor switching element (11, 111) and a second semiconductor switching element (21, 121), the half-bridge switch arrangement comprising:
    a first busbar (30, 130), to which a first terminal of each of the first semiconductor switching elements (11, 111) is electrically connected,
    a second busbar (70, 170), to which a second terminal (115) of each of the first semiconductor switching elements (11, 111) and a first terminal of each of the second semiconductor switching elements (21, 121) are electrically connected,
    a third busbar (40, 140), to which a second terminal (125) of each of the second semiconductor switching elements (21, 121) is electrically connected, and
    a heat sink (180), wherein the first busbar (30, 130) has a first section (131) and a plurality of second sections (132), the second sections (132) of the first busbar (130) adjoining the first section (131) of the first busbar (130), so that a notch (135) is provided between each of the individual second sections of the first busbar (130), wherein one of the plurality of first semiconductor switching elements (11, 111) is arranged at each of the second sections (132) of the first busbar (130), wherein the second busbar (70, 170) has a first section (171) and a plurality of second sections (172), the second sections (172) of the second busbar (170) adjoining the first section (171) of the second busbar (170), so that a notch (175) is provided between each of the individual second sections (172) of the second busbar (170), wherein one of the plurality of second semiconductor switching elements (21, 121) is arranged at each of the second sections (172) of the second busbar (170), wherein the first busbar (130) and the second busbar (170) are arranged relative to each other such that the second sections (172) of the second busbar (170) are arranged within the notches (135) between the second sections (132) of the first busbar (130) in a projection onto the main plane of extension of the first busbar (130), and in that the second sections (132) of the first busbar (130) are each arranged within the notches (175) between the second sections (172) of the second busbar (170) in a projection onto the main plane of extension of the second busbar (170), wherein the third busbar (40, 140) is arranged on a first side of the arrangement comprising the first busbar (30, 130) and the second busbar (70, 170), which side comprises the first semiconductor switching elements (11, 111) and the second semiconductor switching elements (21, 121), and wherein the heat sink (180) is arranged on a second side of the arrangement comprising the first busbar (30, 130) and the second busbar (70, 170) opposite the first side.

2. The half-bridge switch arrangement according to claim 1, wherein the second busbar (170) comprises a plurality of contacts (176), said contacts (176) adjoining the first section (171) of the second busbar (170), each of said contacts (176) of the second busbar (170) being electrically connected to a respective second terminal (115) of the first semiconductor switching elements (111).

3. The half-bridge switch arrangement according to claim 2, wherein the respective second terminal (115) of the first semiconductor switching elements (111) is bent or kinked in each case for connection to the respective contact (176) of the second busbar (170).

4. The half-bridge switch arrangement according to claim 1, wherein the third busbar (140) comprises a first section (141) and a plurality of contacts (146), said contacts (146) adjoining the first section (141) of the third busbar (140), each of said contacts (146) of the third busbar (140) being electrically connected to a respective second terminal (125) of the second semiconductor switching elements (121).

5. The half-bridge switch arrangement according to claim 4, wherein the respective second terminal (125) of the second semiconductor switching elements (121) is bent or kinked in each case for connection to the respective contact (146) of the third busbar (140).

6. The half-bridge switch arrangement according to claim 1,
    wherein the individual second sections (132) of the first busbar (130) are each connected to the respective first semiconductor switching element (111) by a material bond, in particular in each case by a soldered or sintered connection, and wherein an electrical connection between the respective first terminal of the respective first semiconductor switching element (111) and the first busbar (130) is established in each case by this material bond, and/or wherein the individual second sections (172) of the second busbar (170) are each connected to the respective second semiconductor switching element (121) by a material bond, in particular in each case by a soldered or sintered connection, and wherein an electrical connection between the respective first terminal of the respective second semiconductor switching element (121) and the second busbar (170) is produced in each case by this material bond.

7. The half-bridge switch arrangement according to claim 1, further comprising a printed circuit board (160), wherein the printed circuit board (160) is arranged perpendicularly or at least substantially perpendicularly to the first section (131) and the second sections (132) of the first busbar (130) and to the first section (171) and the second sections (172) of the second busbar (130), wherein at least one third terminal (116) of each of the first semiconductor switching elements (111) and at least one third terminal (126) of each of the second semiconductor switching elements (121) is electrically connected to the printed circuit board (160).

8. The half-bridge switch arrangement according to claim 7, wherein at least one elevation (181) is provided on a side of the heat sink (180) facing the printed circuit board (160), wherein the printed circuit board (160) is arranged on this at least one elevation (181).

9. The half-bridge switch arrangement according to claim 1, further comprising a capacitor unit (150) comprising at least one capacitor element, wherein the capacitor unit (150) is arranged on a side of the third busbar (140) facing away from the arrangement comprising the first busbar (130) and the second busbar (170).

10. The half-bridge switch arrangement according to claim 9, wherein at least one first terminal of the capacitor unit (150) is electrically connected to the first busbar (130), wherein the first busbar (130) comprises at least one contact (136), wherein the at least one first terminal of the capacitor unit (150) is electrically connected to the at least one contact (136) of the first busbar (130).

11. The half-bridge switch arrangement according to claim 9, wherein at least one second terminal of the capacitor unit (150) is electrically connected to the third busbar (140), wherein the third busbar (140) has at least one terminal opening (149) on its side facing away from the arrangement comprising the first busbar (130) and the second busbar (170), wherein the at least one second terminal of the capacitor unit (150) is electrically connected to the at least one terminal opening (149) of the third busbar (140).

12. The half-bridge switch arrangement according to claim 10, wherein at least one second terminal of the capacitor unit (150) is electrically connected to the third busbar (140), wherein the third busbar (140) has at least one terminal opening (149) on its side facing away from the arrangement comprising the first busbar (130) and the second busbar (170), wherein the at least one second terminal of the capacitor unit (150) is electrically connected to the at least one terminal opening (149) of the third busbar (140).

13. The half-bridge switch arrangement according to claim 1, further comprising at least one first electrical heat sink insulating layer (191), wherein the arrangement comprising the first busbar (130) and the second busbar (170) is electrically insulated from the heat sink (180) by the at least one first electrical heat sink insulating layer (191), wherein the at least one first electrical heat sink insulating layer (191) is arranged on a side of the second sections (132) of the first busbar (130) facing away from the first semiconductor switching elements (111) and/or on a side of the second sections (172) of the second busbar (170) facing away from the second semiconductor switching elements (121).

14. The half-bridge switch arrangement according to claim 1, further comprising at least one second electrical heat sink insulating layer (192), wherein the first busbar (130) is electrically insulated from the heat sink (180) by the at least one second electrical heat sink insulating layer (192), wherein the at least one second electrical heat sink insulating layer (192) is arranged between the first busbar (130) and the heat sink (180).

15. The half-bridge switch arrangement according to claim 1, further comprising a retaining element (101), wherein the retaining element (101) is arranged between the third busbar (140) and the arrangement of the first busbar (130) and the second busbar (170), wherein the retaining element (101) is arranged to press the arrangement of the first busbar (130) and the second busbar (170) against the heat sink.

* * * * *